(12) United States Patent  
Jeong et al.

(10) Patent No.: US 8,102,043 B2
(45) Date of Patent: Jan. 24, 2012

(54) STACKED INTEGRATED CIRCUIT AND PACKAGE SYSTEM AND METHOD FOR MANUFACTURING THEREOF

(75) Inventors: Tae Sung Jeong, Ichon-si (KR); Hyeog Chan Kwon, Seoul (KR); Youngcheol Kim, Youngin-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/006,278

(22) Filed: Jan. 13, 2011

(65) Prior Publication Data

US 2011/0108976 A1 May 12, 2011

Related U.S. Application Data

(63) Continuation of application No. 11/255,740, filed on Oct. 21, 2005, now Pat. No. 7,875,966.

(60) Provisional application No. 60/653,156, filed on Feb. 14, 2005.

(51) Int. Cl.
*H01L 25/07* (2006.01)
*H01L 21/98* (2006.01)

(52) U.S. Cl. .................................................... 257/693

(58) Field of Classification Search .................. 257/678, 257/676, 698, 723, 738, 706, 685, 686, E23.001–E23.194, 257/726, E25.031–E25.032, E23.042, 41, 257/81, 82, 91, 99, 177–182, 276, 457, 459, 257/502, 503, 573, 584, 602, 621, 664–677, 257/688–700, 734–786; 438/6, 28, 66, 67, 438/107, 109

See application file for complete search history.

(56) References Cited

U.S. PATENT DOCUMENTS

| | | | | |
|---|---|---|---|---|
| 6,781,241 B2 * | 8/2004 | Nishimura et al. | ........... | 257/777 |
| 6,798,049 B1 * | 9/2004 | Shin et al. | ...................... | 257/678 |
| 6,878,570 B2 * | 4/2005 | Lyu et al. | ..................... | 438/106 |
| 6,882,056 B2 * | 4/2005 | Komiyama et al. | ........... | 257/777 |
| 6,893,897 B2 * | 5/2005 | Sweterlitsch | ................. | 438/107 |
| 6,906,416 B2 * | 6/2005 | Karnezos | ...................... | 257/723 |
| 6,906,424 B2 * | 6/2005 | Kinsman | ....................... | 257/777 |
| 6,921,968 B2 * | 7/2005 | Chung | ........................... | 257/686 |
| 2004/0007771 A1 * | 1/2004 | Shin et al. | ...................... | 257/686 |
| 2005/0184377 A1 * | 8/2005 | Takeuchi et al. | ............... | 257/686 |
| 2006/0033193 A1 * | 2/2006 | Suh et al. | ....................... | 257/686 |

* cited by examiner

*Primary Examiner* — Dao H Nguyen
*Assistant Examiner* — Tram H Nguyen
(74) *Attorney, Agent, or Firm* — Mikio Ishimaru

(57) ABSTRACT

A method for manufacturing a stacked integrated circuit and package system includes: attaching a high temperature resistant layer on a top substrate; mounting a first top integrated circuit on the high temperature resistant layer; mounting a second top integrated circuit on the first top integrated circuit; molding an encapsulant over the first top integrated circuit, the second top integrated circuit and the top substrate; mounting a third top integrated circuit over the first top integrated circuit on a surface opposite the second top integrated circuit; mounting a fourth top integrated circuit on the third top integrated circuit; molding an encapsulant over the third top integrated circuit, the fourth top integrated circuit and the top substrate; forming top electrical connectors on a lower surface of the top substrate; and mounting a bottom package to the top electrical connectors.

13 Claims, 6 Drawing Sheets

STACKED INTEGRATED CIRCUIT AND PACKAGE SYSTEM AND METHOD FOR MANUFACTURING THEREOF

CROSS-REFERENCE TO RELATED APPLICATION(S)

This application is a continuation of U.S. patent application Ser. No. 11/255,740 filed Oct. 21, 2005, which claims the benefit of U.S. Provisional Patent Application Ser. No. 60/653,156 filed Feb. 14, 2005, and the subject matter thereof is hereby incorporated herein by reference thereto.

TECHNICAL FIELD

The present invention relates generally to integrated circuit package systems, and more particularly to a system for a stacked integrated circuit and package.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

As multi-die and package stacking becomes more and more common, known good die issues are becoming critical for cost saving issues and throughput yield. For example, in a four-die stack package, a single die can make the whole package unusable even if the other three dies are fully functional. One of the ways to overcome this problem is by using package stacking which can overcome known good die issues since die functionality can be checked after being packaged and before being placed on top of another known good package. On the other hand, miniaturization is forcing package profiles to become thinner and thinner which may become a road block to widespread use of package stacking due to the larger height profiles compared to die stacking.

Thus a need still remains for an integrated circuit package system to provide increasing density without sacrificing reliability, yield and height profiles. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing a stacked integrated circuit and package system including: attaching a high temperature resistant layer on a top substrate; mounting a first top integrated circuit on the high temperature resistant layer; mounting a second top integrated circuit on the first top integrated circuit; molding an encapsulant over the first top integrated circuit, the second top integrated circuit and the top substrate; mounting a third top integrated circuit over the first top integrated circuit on a surface opposite the second top integrated circuit; mounting a fourth top integrated circuit on the third top integrated circuit; molding an encapsulant over the third top integrated circuit, the fourth top integrated circuit and the top substrate; forming top electrical connectors on a lower surface of the top substrate; and mounting a bottom package to the top electrical connectors.

The present invention provides a stacked integrated circuit and package system including: a first top integrated circuit over an upper surface of a top substrate; a second top integrated circuit over a lower surface of the top substrate; top electrical connectors on the lower surface of the top substrate; and a bottom package connected to the top electrical connectors.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
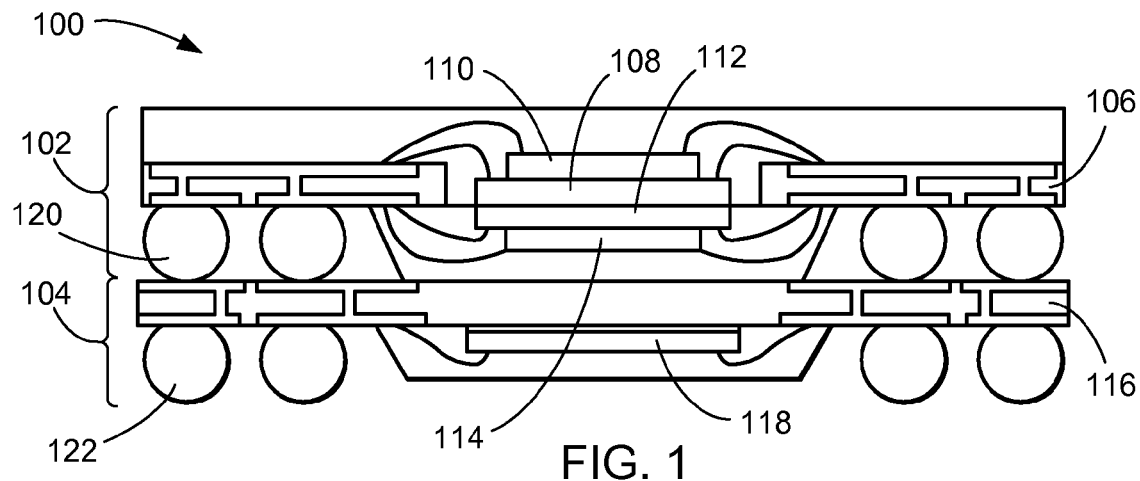
FIG. 1 is a cross-sectional view of a stacked integrated circuit and package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that one element is attached to another element and the term "in" means that one element is included within another.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a stacked integrated circuit and package system 100 in an embodiment of the present invention. The stacked integrated circuit and package system 100 includes a top package 102 and a bottom package 104. The top package 102 includes a top substrate 106, a first top integrated circuit 108 in the top substrate 106, a second top integrated circuit 110 on and over the first top integrated circuit 108, a third top integrated circuit 112 on and below the first top integrated circuit, and a fourth top integrated circuit 114 on and below the third top integrated circuit 112. The bottom package 104, such as a die down ball grid array or a chip scale package, includes a bottom substrate 116 and a bottom integrated circuit 118. Top electrical connectors 120, such as solder ball grid arrays, have a flattened side coplanar with a side of the first top integrated circuit 108 and connect the top package 102 and the bottom package 104. Bottom electrical connectors 122, such as solder ball grid arrays, provide electrical connection to the next level system, such as printed circuit boards or another package.

For illustrative purposes, the stacked integrated circuit and package system 100 is shown with four integrated circuits in the top package 102 and one integrated circuit in the bottom package 104, although it is understood that the number of integrated circuits in the top package 102 or the bottom package 104 may be different, as well.

Figure 2:
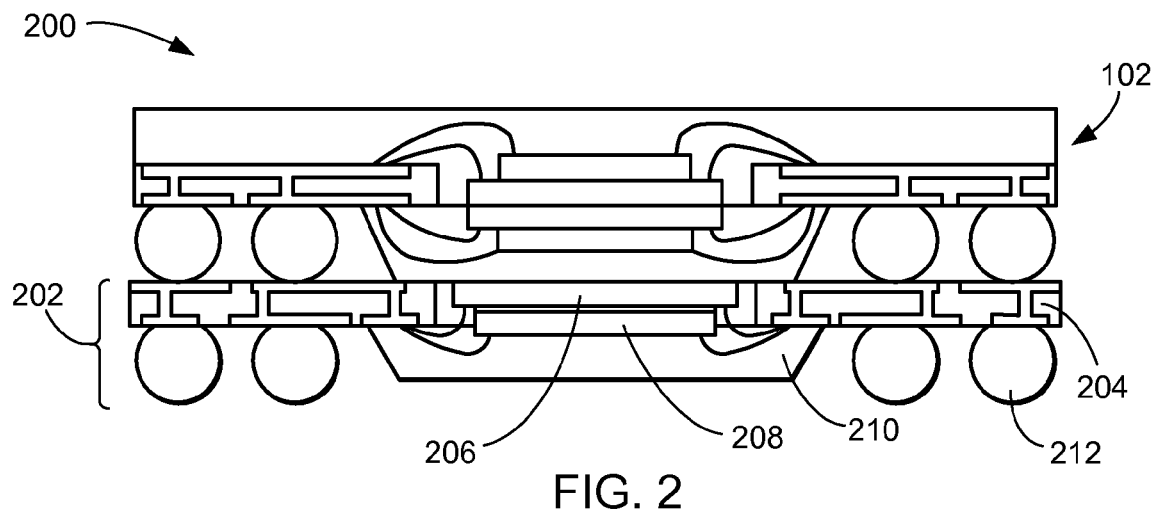
FIG. 2 is a cross-sectional view of a stacked integrated circuit and package system in an alternative embodiment of the present invention.

Referring now to FIG. 2, therein is shown a cross-sectional view of a stacked integrated circuit and package system 200 in an alternative embodiment of the present invention. The stacked integrated circuit and package system 200 includes the top package 102, and a bottom package 202. The bottom package 202 includes a bottom substrate 204, a first bottom integrated circuit 206, and a second bottom integrated circuit 208. An encapsulant 210 covers the first bottom integrated circuit 206, the second bottom integrated circuit 208 and partially covers the bottom substrate 204. Bottom electrical connectors 212, such as solder ball grid arrays, provide electrical connection to the next level system, such as a printed circuit board or another package.

The first bottom integrated circuit 206 may be attached to the bottom substrate 204 with a temporary layer (not shown) such as a high temperature resistant layer. The second bottom integrated circuit 208 is attached to the first bottom integrated circuit 206. The second bottom integrated circuit 208 may provide additional function and capacity for the stacked integrated circuit and package system 200, as compared to the stacked integrated circuit and package system 100.

For illustrative purposes, the stacked integrated circuit and package system 200 is shown with four integrated circuits in the top package 102 and two integrated circuits in the bottom package 202, although it is understood that the number of integrated circuits in the top package 102 or the bottom package 202 may be different, as well.

Figure 3:
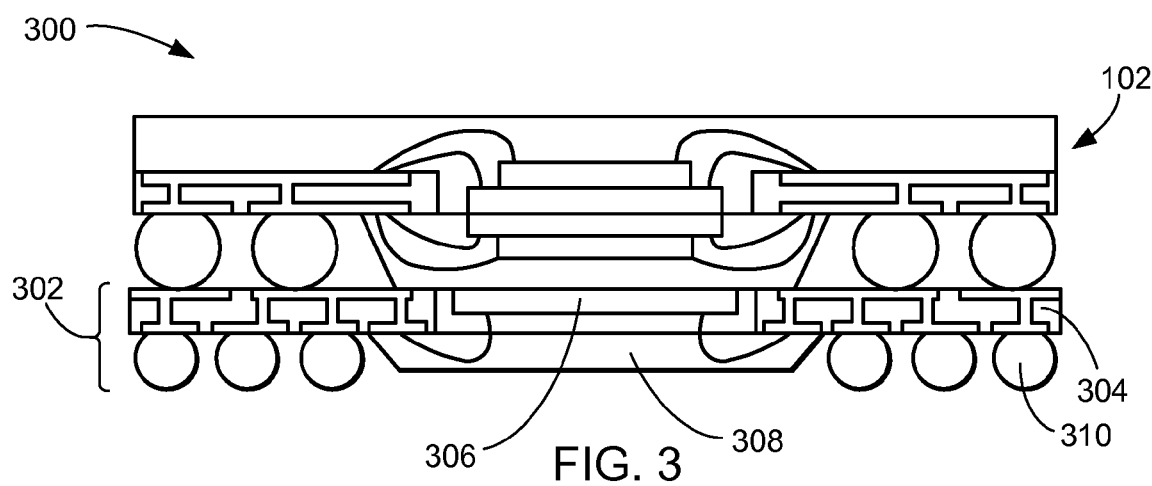
FIG. 3 is a cross-sectional view of a stacked integrated circuit and package system in another alternative embodiment of the present invention.

Referring now to FIG. 3, therein is shown a cross-sectional view of a stacked integrated circuit and package system 300 in another alternative embodiment of the present invention. The stacked integrated circuit and package system 300 includes the top package 102, and a bottom package 302. The bottom package 302 includes a bottom substrate 304, and a bottom integrated circuit 306. The bottom integrated circuit 306 may be attached to the bottom substrate 304 with a temporary layer (not shown) such as a high temperature resistant layer. An encapsulant 308 covers the bottom integrated circuit 306 and partially covers the bottom substrate 304.

Bottom electrical connectors 310, such as solder bumps or solder ball grid arrays, provide electrical connection to the next level system, such as a printed circuit board or another package. The bottom electrical connectors 310 have a diameter smaller than those of the bottom electrical connectors 122 in FIG. 1 (not shown) and the bottom electrical connectors 212 in FIG. 2 (not shown). The smaller diameter provides a larger number of the bottom electrical connectors 310 and a lower z-height of the bottom package 302.

For illustrative purposes, the stacked integrated circuit and package system 300 is shown with four integrated circuits in the top package 102 and one integrated circuits in the bottom package 302, although it is understood that the number of integrated circuits in the top package 102 or the bottom package 302 may be different, as well.

Figure 4:
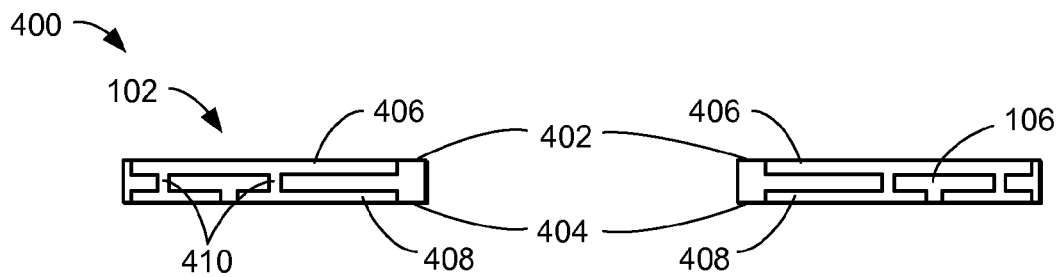
FIG. 4 is a cross-sectional view of the top package in a substrate formation phase.

Referring now to FIG. 4, therein is shown a cross-sectional view of the top package 102 in a substrate formation phase. The top substrate 106, such as thin mold or thin core, includes an upper surface 402 and a lower surface 404. The upper surface 402 and the lower surface 404 include an upper metal layer 406 and a lower metal layer 408, respectively. The upper metal layer 406 and the lower metal layer 408 may be electrically connected by interlayer connections 410, such as contacts, vias, columns or posts. The upper metal layer 406 and the lower metal layer 408 include connection regions (not shown) for electrically connecting integrated circuits (not shown). The lower surface 404 also includes interconnection regions (not shown) of the lower metal layer 408 for attaching the top electrical connectors 120.

Figure 5:
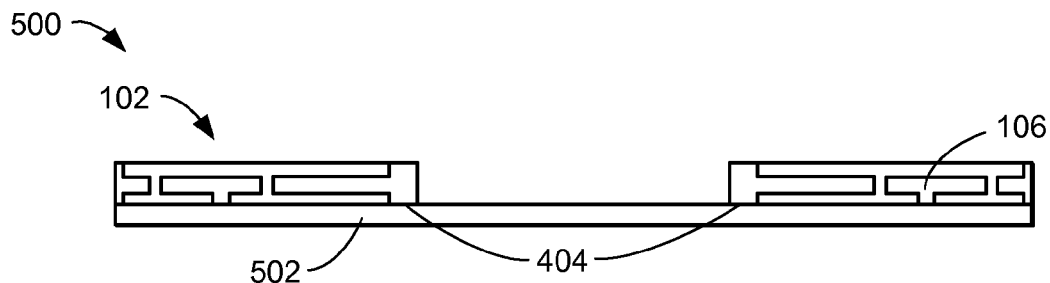
FIG. 5 is a cross-sectional view of the top package in a temporary layer attachment phase after the substrate formation phase of FIG. 4.

Referring now to FIG. 5, therein is shown a cross-sectional view of the top package 102 in a temporary layer attachment phase after the substrate formation phase of FIG. 4. A high temperature resistant layer 502 is attached to the lower surface 404 of the top substrate 106. The high temperature resistant layer 502 remains substantially fixed during subsequent processing that may include high temperatures. The high temperature resistant layer 502 provides adhesive and structural integrity properties such that attached integrated circuits (not shown) and the top substrate 106 remain substantially fixed during subsequent processing, such as attaching a second die or attaching electrical connections or molding. The high temperature resistant layer 502 also provides adhesive and structural integrity properties such that the high temperature resistant layer 502 may be removed after a molding process.

Figure 6:
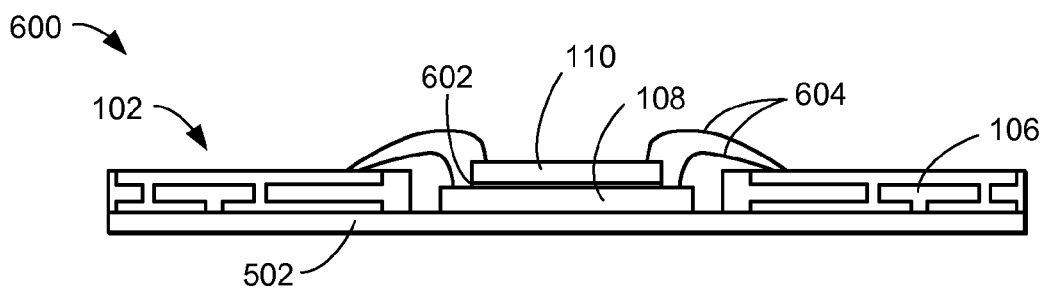
FIG. 6 is a cross-sectional view of the top package in an integrated circuit attachment phase after the temporary layer attachment phase of FIG. 5.

Referring now to FIG. 6, therein is shown a cross-sectional view of the top package 102 in an integrated circuit attachment phase after the temporary layer attachment phase of FIG. 5. The first top integrated circuit 108 is mounted to the high temperature resistant layer 502 to have a bottom of the first top integrated circuit 108 coplanar with the lower surface 404 (shown in FIG. 4) of the top substrate 106. The second top integrated circuit 110 is mounted directly on the first top integrated circuit 108 with an adhesive layer 602, such as a film or a paste. The first top integrated circuit 108 and the second top integrated circuit 110 are electrically connected to the top substrate 106 with electrical interconnects 604. The first top integrated circuit 108 may be electrically connected to connection regions (not shown) on the top substrate 106 or the second top integrated circuit 110. The electrical interconnects 604, such as wire bonds, may be connected to multiple integrated circuits simultaneously.

Figure 7:
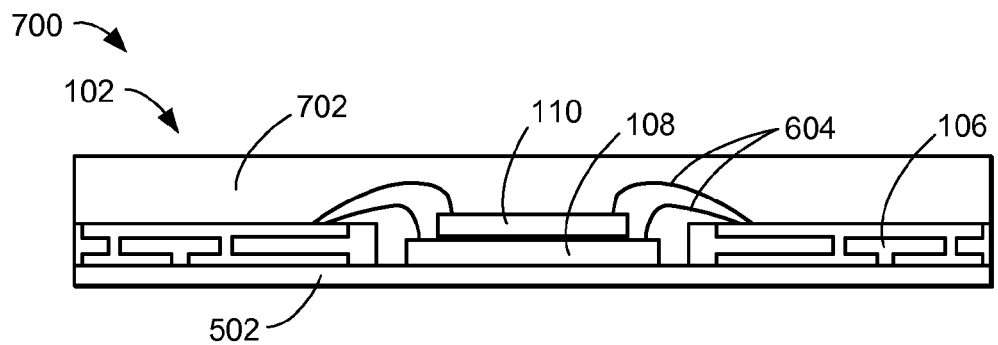
FIG. 7 is a cross-sectional view of a cross-sectional view of the top package in a mold application phase after the integrated circuit attachment phase of FIG. 6.

Referring now to FIG. 7, therein is shown a cross-sectional view of the top package 102 in a mold application phase after the integrated circuit attachment phase of FIG. 6. The high temperature resistant layer 502 substantially fixes positions of the first top integrated circuit 108, the second top integrated circuit 110 and the top substrate 106 during the molding process. A molding process, such as transfer molding or center gate molding or encapsulation, applies an encapsulant 702. The encapsulant 702 covers the first top integrated circuit 108, the second top integrated circuit 110, the electrical interconnects 604 and the top substrate 106. The encapsulant 702 is cured to form a substantially fixed layer with the high temperature resistant layer 502 substantially intact.

Figure 8:
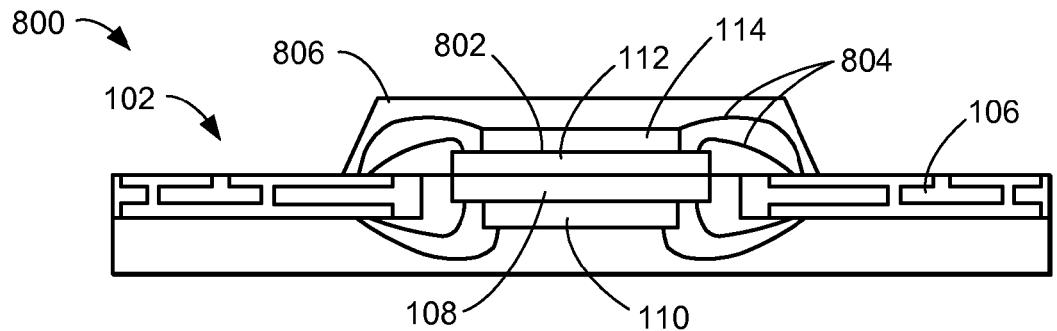
FIG. 8 is a cross-sectional view of a cross-sectional view of the top package in another integrated circuit attachment phase after the mold application phase of FIG. 7.

Referring now to FIG. 8, therein is shown a cross-sectional view of the top package 102 in another integrated circuit attachment phase after the mold application phase of FIG. 7. The high temperature resistant layer 502 in FIG. 5 (not shown) is removed from the top substrate 106 and the first top integrated circuit 108. The first top integrated circuit 108 and the second top integrated circuit 110, may be electrically tested to verify their functionality and performance. The third top integrated circuit 112 is mounted over the first top integrated circuit 108, on a side opposite the second top integrated circuit 110. The fourth top integrated circuit 114 is mounted to the third top integrated circuit 112 with an adhesive layer 802, such as a film or a paste.

The third top integrated circuit 112 and the fourth top integrated circuit 114 are electrically connected to the top substrate 106 with electrical interconnects 804. The third top integrated circuit 112 may be electrically connected to connection regions (not shown) on the top substrate 106 or the fourth top integrated circuit 114. The electrical interconnects 804, such as wire bonds, may be connected to multiple integrated circuits simultaneously. A molding process, such as transfer molding or center gate molding or encapsulation, applies an encapsulant 806 covering the third top integrated circuit 112, the fourth top integrated circuit 114, the electrical interconnects 804 and partially covering the top substrate 106.

Figure 9:
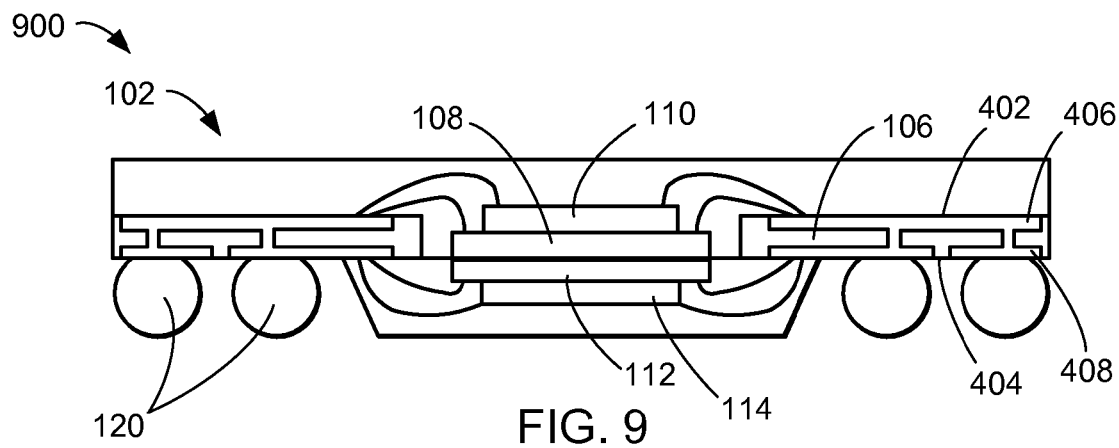
FIG. 9 is a cross-sectional view of the top package in a connector formation phase after another integrated circuit attachment phase of FIG. 8.

Referring now to FIG. 9, therein is shown a cross-sectional view of the top package 102 in a connector formation phase after another integrated circuit attachment phase of FIG. 8. The top electrical connectors 120 are formed on the lower surface 404. The top electrical connectors 120 attach the top package 102 and the bottom package 104 in FIG. 1 (not shown) with a connect process, such as co-solder ball reflow or multi-reflow. The lower surface 404 includes interconnect regions (not shown) of the lower metal layer 408 for attaching the top electrical connectors 120. The top electrical connectors 120 also provide connectivity to the first top integrated circuit 108, the second top integrated circuit 110, the third top integrated circuit 112 and the fourth top integrated circuit 114, through the upper metal layer 406 and the lower metal layer 408.

In an example of a package profile, the top substrate 106 is 0.30 mm thick, the first top integrated circuit 108 and the second top integrated circuit 110 is 0.075 mm and the adhesive layer 602 is 0.020 mm, providing a total integrated circuit stack thickness of 0.17 mm. The thickness of the encapsulant 702 may be limited by a height of the electrical interconnects 604 of 0.075 mm measured from the upper surface 402 to the height of the electrical interconnects 604, such that the encapsulant 702 may use a thickness of 0.15 mm or 0.10 mm. For the third top integrated circuit 112 and the fourth top integrated circuit 114, a second stack height will be 0.17 mm and the height of the electrical interconnects 804 may be less than 0.075 mm, as measured from the top of the fourth top integrated circuit 114 to the height of the electrical interconnects 804, such that the thickness of the encapsulant 806 may be 0.35 mm.

The top electrical connectors 120 should use a minimum dimension of 0.4 mm (larger than the 0.35 mm thickness of the encapsulant 702) such that the total profile of the top package 102 can be as small as 0.85 mm for a 4 integrated circuit stack. Similarly, the total profile of the bottom package 104 can be as small as 0.55 mm, if the bottom substrate is 0.3 mm thick and the bottom electrical connectors are 0.25 mm in diameter. The total profile could be as small as 1.4 mm before final forming of the bottom electrical interconnects 122 and may be smaller after final forming.

For illustrative purposes, dimensions of the example of a package profile are provided, although it is understood that the dimensions of the elements of the example of a package profile may be different, as well. Further, for illustrative purposes, dimensions for the total profile of the top package, the total profile of the bottom package and the total profile are provided, although it is understood that the dimensions of the total profile of the top package, total profile of the bottom package and the total profile may be different, as well.

Figure 10:
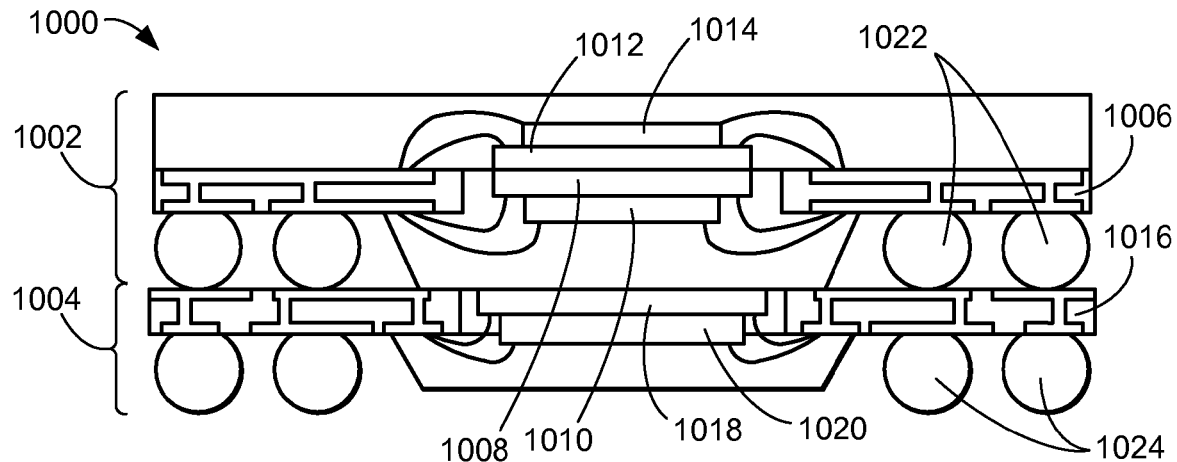
FIG. 10 is a cross-sectional view of a stacked integrated circuit and package system in yet another alternative embodiment of the present invention.

Referring now to FIG. 10, therein is shown a cross-sectional view of a stacked integrated circuit and package system 1000 in yet another alternative embodiment of the present invention. The stacked integrated circuit and package system 1000 includes a top package 1002 and a bottom package 1004. The top package 1002 includes a top substrate 1006, a first top integrated circuit 1008, a second top integrated circuit 1010, a third top integrated circuit 1012 and a fourth top integrated circuit 1014. The bottom package 1004 includes a bottom substrate 1016, a first bottom integrated circuit 1018 and a second bottom integrated circuit 1020. Top electrical connectors 1022, such as solder ball grid arrays, connect the top package 1002 and the bottom package 1004. Bottom electrical connectors 1024, such as solder ball grid arrays, provide electrical connection to the next level system, such as printed circuit boards or another package.

For illustrative purposes, the stacked integrated circuit and package system 1000 is shown with four integrated circuits in the top package 1002 and two integrated circuits in the bottom package 1004, although it is understood that the number of integrated circuits in the top package 1002 or the bottom package 1004 may be different, as well.

Figure 11:
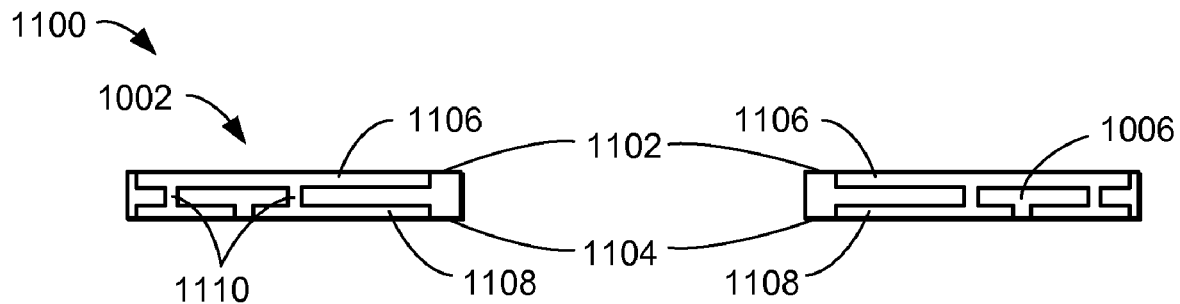
FIG. 11 is a cross-sectional view of the top package in a substrate forming phase.

Referring now to FIG. 11, therein is shown a cross-sectional view of the top package 1002 in a substrate forming phase. The top substrate 1006, such as thin mold or thin core, includes an upper surface 1102 and a lower surface 1104. The upper surface 1102 and the lower surface 1104 include an upper metal layer 1106 and a lower metal layer 1108, respectively. The upper metal layer 1106 and the lower metal layer 1108 may be electrically connected by interlayer connections 1110, such as contacts, vias columns or posts. The upper metal layer 1106 and the lower metal layer 1108 include connection regions (not shown) for electrically connecting integrated circuits (not shown). The lower surface 1104 also includes interconnection regions (not shown) of the lower metal layer 1108 for attaching the top electrical connectors 1022.

Figure 12:
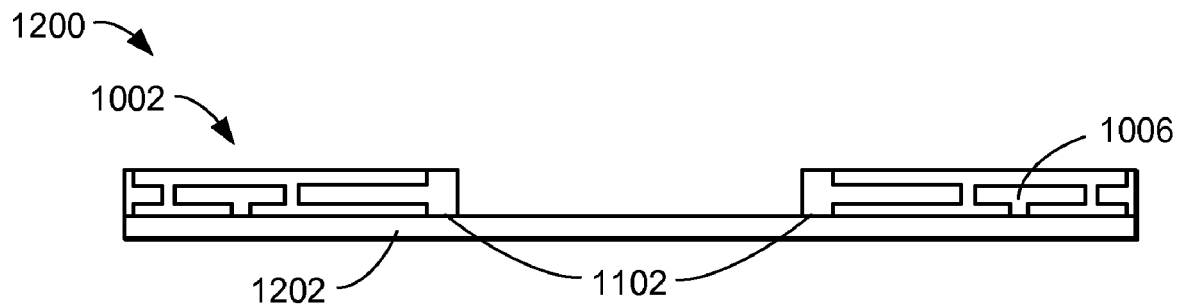
FIG. 12 is a cross-sectional view of the top package in a temporary material attaching phase after the substrate formation phase of FIG. 11.

Referring now to FIG. 12, therein is shown a cross-sectional view of the top package 1002 in a temporary material attaching phase after the substrate formation phase of FIG. 11. A high temperature resistant layer 1202 is attached to the upper surface 1102 of the top substrate 1006. The high temperature resistant layer 1202 remains substantially fixed during subsequent processing that may include high temperatures. The high temperature resistant layer 1202 provides adhesive and structural integrity properties such that attached integrated circuits (not shown) and the top substrate 1006 remain substantially fixed during subsequent processing, such as attaching a second die or attaching electrical connections or molding. The high temperature resistant layer 1202 also provides adhesive and structural integrity properties such that the high temperature resistant layer 1202 may be removed after a molding process.

Figure 13:
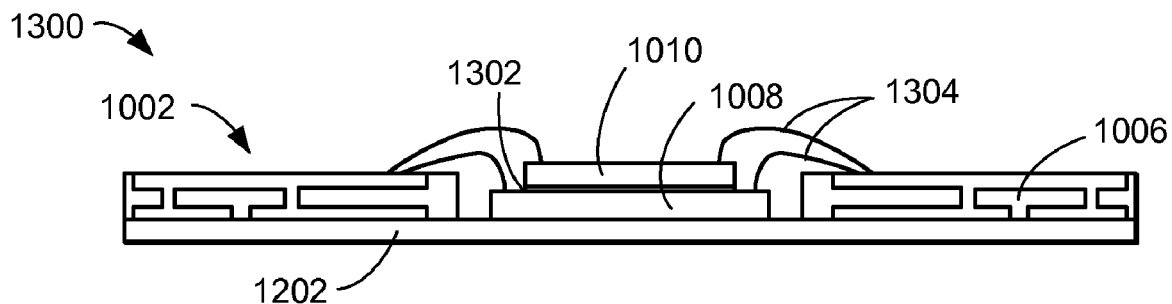
FIG. 13 is a cross-sectional view of the top package in an integrated circuit attachment phase after the temporary layer attachment phase of FIG. 12.

Referring now to FIG. 13, therein is shown a cross-sectional view of the top package 1002 in an integrated circuit attachment phase after the temporary layer attachment phase of FIG. 12. The first top integrated circuit 1008 is mounted to the high temperature resistant layer 1202. The second top integrated circuit 1010 is mounted to the first top integrated circuit 1008 with an adhesive layer 1302, such as a film or a paste. The first top integrated circuit 1008 and the second top integrated circuit 1010 are electrically connected to the top substrate 1006 with electrical interconnects 1304. The first top integrated circuit 1008 may be electrically connected to connection regions (not shown) on the top substrate 1006 or the second top integrated circuit 1010. The electrical interconnects 1304, such as wire bonds, may be connected to multiple integrated circuits simultaneously.

Figure 14:
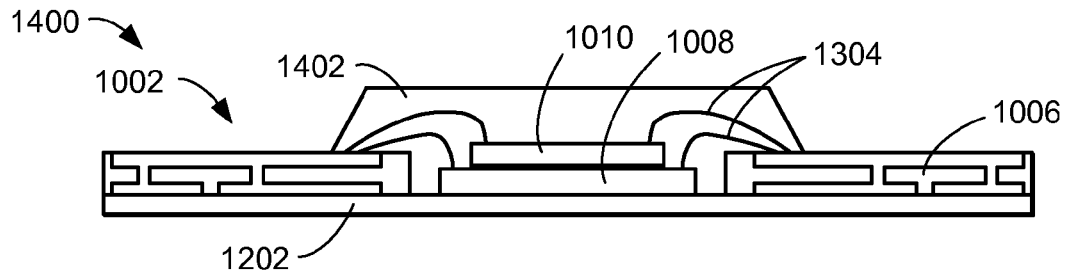
FIG. 14 is a cross-sectional view of the top package in a mold application phase after the integrated circuit attachment phase of FIG. 13.

Referring now to FIG. 14, therein is shown a cross-sectional view of the top package 1002 in a mold application phase after the integrated circuit attachment phase of FIG. 13. The high temperature resistant layer 1202 substantially fixes positions of the first top integrated circuit 1008, the second top integrated circuit 1010 and the top substrate 106 during the molding process. A molding process, such as transfer molding or center gate molding or encapsulation, applies an encapsulant 1402. The encapsulant 1402 covers the first top integrated circuit 1008, the second top integrated circuit 1010, the electrical interconnects 1304 and partially covers the top substrate 1006. The encapsulant 1402 is cured to form a substantially fixed layer with the high temperature resistant layer 1202 substantially intact.

Figure 15:
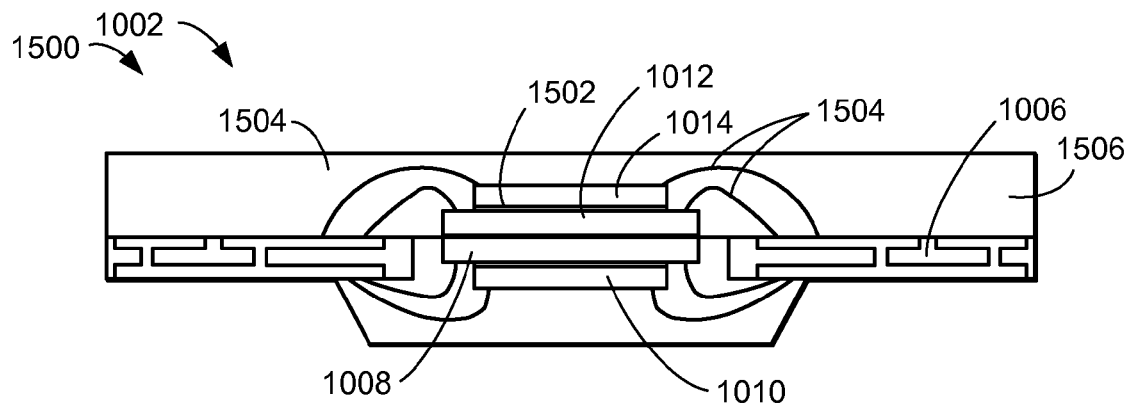
FIG. 15 is a cross-sectional view of the top package in another integrated circuit attachment phase after the mold application phase of FIG. 14.

Referring now to FIG. 15, therein is shown a cross-sectional view of the top package 1002 in another integrated circuit attachment phase after the mold application phase of FIG. 14. The high temperature resistant layer 1202 in FIG. 12 (not shown) is removed from the top substrate 1006 and the first top integrated circuit 1008. The first top integrated circuit 1008 and the second top integrated circuit 1010 may be electrically tested to verify their functionality and performance. The third top integrated circuit 1012 is mounted over the first top integrated circuit 1008, on a side opposite the second top integrated circuit 1010. The fourth top integrated circuit 1014 is mounted to the third top integrated circuit 1012 with an adhesive layer 1502, such as a film or a paste.

The third top integrated circuit 1012 and the fourth top integrated circuit 1014 are electrically connected to the top substrate 1006 with electrical interconnects 1504. The third top integrated circuit 1012 may be electrically connected to connection regions (not shown) on the top substrate 1006 or the fourth top integrated circuit 1014. The electrical interconnects 1504, such as wire bonds, may be connected to multiple integrated circuits simultaneously. A molding process, such as transfer molding or center gate molding or encapsulation, applies an encapsulant 1506 covering the third top integrated circuit 1012, the fourth top integrated circuit 1014, the electrical interconnects 1504 and partially covering the top substrate 106.

Figure 16:
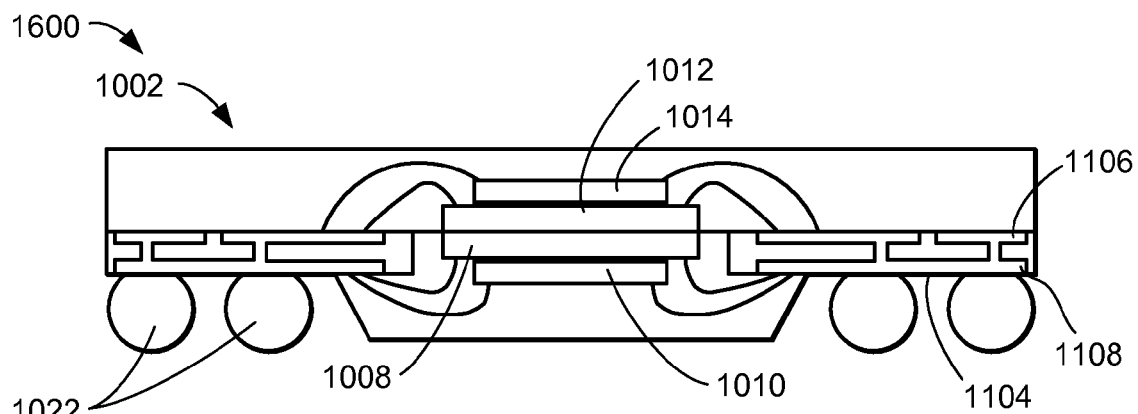
FIG. 16 is a cross-sectional view of the top package in a connector formation phase after another integrated circuit attachment phase of FIG. 15.

Referring now to FIG. 16, therein is shown a cross-sectional view of the top package 1002 in a connector formation phase after another integrated circuit attachment phase of FIG. 15. The top electrical connectors 1022 are formed on the lower surface 1104. The top electrical connectors 1022 attach the top package 1002 and the bottom package 1004 in FIG. 10 (not shown) with a connect process, such as co-solder ball reflow or multi-reflow. The lower surface 1104 includes interconnect regions (not shown) of the lower metal layer 1108 for attaching the top electrical connectors 1022. The top electrical connectors 1022 also provide connectivity to the first top integrated circuit 1008, the second top integrated circuit 1010, the third top integrated circuit 1012 and the fourth top integrated circuit 1014, through the upper metal layer 1106 and the lower metal layer 1108.

Figure 17:
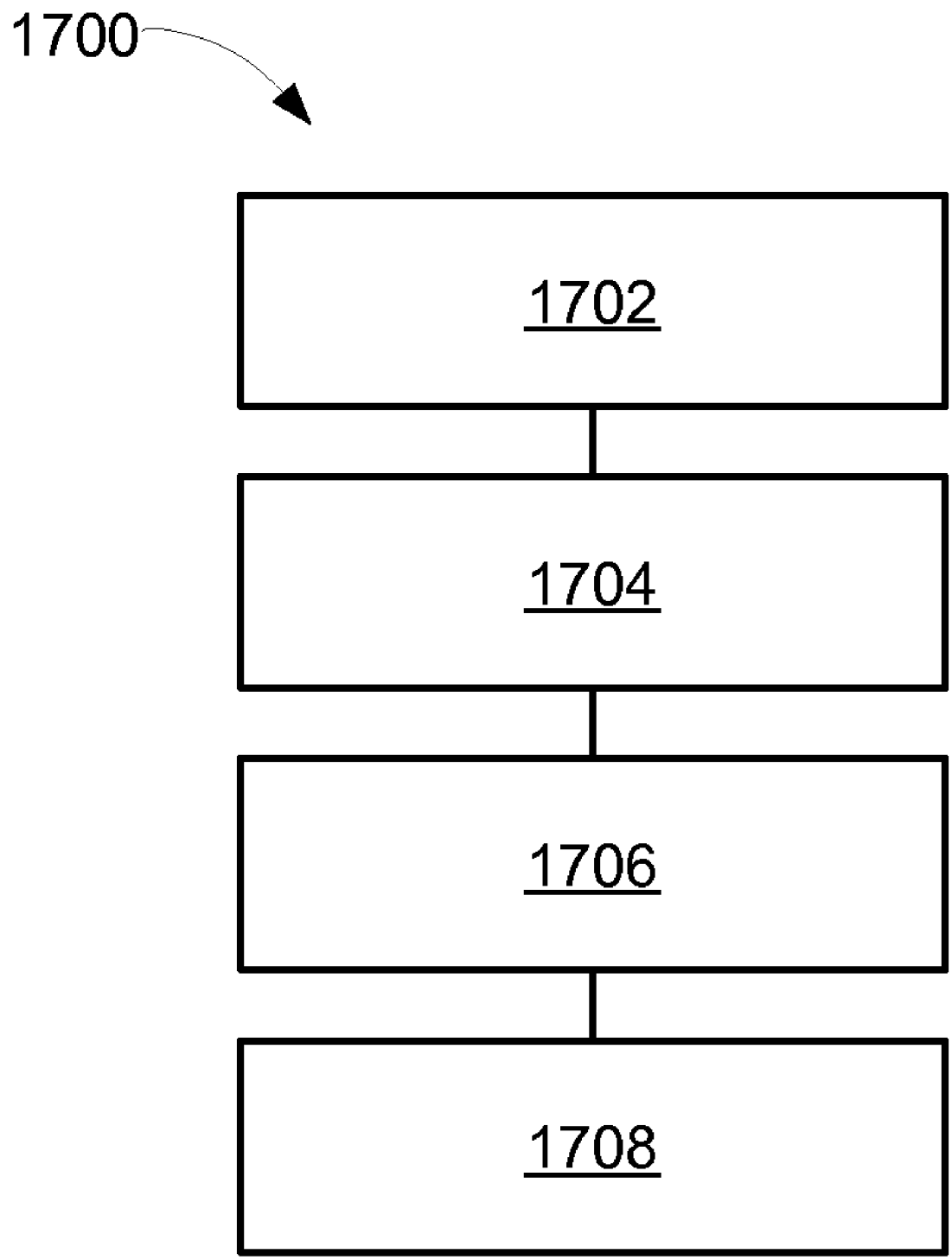
FIG. 17 is a flow chart of a system for a stacked integrated circuit and package in an embodiment of the present invention.

Referring now to FIG. 17, therein is shown a flow chart of a stacked integrated circuit and package system 1700 for manufacturing the stacked integrated circuit and package system 100 in accordance with an embodiment of the present invention. The system 1700 includes attaching a first top integrated circuit over an upper surface of a top substrate in a block 1702; attaching a second top integrated circuit over a lower surface of the top substrate in a block 1704; forming top electrical connectors on the lower surface of the top substrate in a block 1706; and connecting a bottom package to the top electrical connectors in a block 1708.

In greater detail, a method to fabricate the stacked integrated circuit and package system 100, in an embodiment of the present invention, is performed as follows:

1. Attaching the first high temperature resistant layer on the top substrate 106. (FIG. 5)
2. Mounting the first top integrated circuit 108 on the high temperature resistant layer 502. (FIG. 6)
3. Mounting the second top integrated circuit 110 on the first top integrated circuit 108. (FIG. 6)
4. Molding the encapsulant 702 over the first top integrated circuit 108, the second top integrated circuit 110 and the top substrate 106. (FIG. 7)
5. Mounting the third top integrated circuit 112 over the first top integrated circuit 108 on a surface opposite the second top integrated circuit 110. (FIG. 8)
6. Mounting the fourth top integrated circuit 114 on the third top integrated circuit 112. (FIG. 8)
7. Molding the encapsulant 806 over the third top integrated circuit 112, the fourth top integrated circuit 114 and the top substrate 106. (FIG. 8)
8. Forming the top electrical connectors 120 on the lower surface 404 of the top substrate 106. (FIG. 9)
9. Mounting a bottom package 104 to the top electrical connectors 120. (FIG. 1)

It has been discovered that the present invention thus has numerous advantages.

An advantage is that the present invention improves manufacturing yields and processes. The multiple integrated circuits may be tested individually during intermediate phases of the processing. Die functionality can be checked after being packaged and before being placed on top of another known good package. If bad integrated circuit dies are found, the integrated circuit dies can be removed and the package recycled. This prevents costly scrap of good integrated circuits and packages after combining failed integrated circuits.

It has been discovered that the disclosed structure reduces the size of multiple integrated circuit packages having multifunction. The stacking of integrated circuit packages is more compact and space efficient with respect to the footprint or planar dimension. As package profiles are being forced to become thinner and thinner the disclosed structure provides a decreased package total profile. The elimination of some packaging, even chip-scale, provides significant size reductions.

It has also been discovered that the disclosed structure provides improved electrical performance between the integrated circuits. Minimizing the distance between multiple integrated circuits provides significant improvements in electrical signals between the integrated circuits. The size reduction also provides shorter interconnections between integrated circuits and the next level system or product, such as a printed circuit board, chip carrier or another integrated circuit package. The shorter interconnections reduce parasitics and improve speed.

Yet another discovery of the disclosed structure is improvements in the system or product. The compactness and space efficiency contribute area and volume improvements and the improved operating speeds and electrical performance contribute power and heat savings to the product. Also, improved connectivity between the protruding solder ball and the printed circuit board provide significant improvements in the system or product. The solder interconnect provides improved manufacturing, such as cost, complexity, volume, yield and compatibility, over other interconnect technologies, such as land grid arrays.

These and other valuable aspects of the present invention consequently further the state of the technology to at least the next level.

Thus, it has been discovered that the stacked integrated circuit and package system method and apparatus of the present invention furnish important and heretofore unknown and unavailable solutions, capabilities, and functional advantages. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method for manufacturing a stacked integrated circuit and package system comprising:
    attaching a high temperature resistant layer on a top substrate;
    mounting a first top integrated circuit on the high temperature resistant layer and the first top IC is within the top substrate;
    mounting a second top integrated circuit on the first top integrated circuit;
    molding an encapsulant over the first top integrated circuit, the second top integrated circuit and the top substrate;
    mounting a third top integrated circuit over the first top integrated circuit on a surface opposite the second top integrated circuit;
    mounting a fourth top integrated circuit on the third top integrated circuit;
    molding an encapsulant over the third top integrated circuit, the fourth top integrated circuit and the top substrate;
    forming top electrical connectors on a lower surface of the top substrate so a flattened side of the electrical connector is coplanar with a side of the first top integrated circuit and a side of the third top integrated circuit; and
    mounting a bottom package to the top electrical connectors.

2. The method as claimed in claim 1 wherein mounting the bottom package further comprises:
    attaching a temporary layer on a bottom substrate;
    mounting a first bottom integrated circuit on the temporary layer; and
    mounting a second bottom integrated circuit on the first bottom integrated circuit.

3. The method as claimed in claim 1 wherein mounting the bottom package further comprises:
    attaching a temporary layer on a bottom substrate; and
    mounting a bottom integrated circuit on the temporary layer.

4. The method as claimed in claim 1 wherein mounting the bottom package further comprises forming bottom electrical connectors with smaller dimensions than the top electrical connectors dimensions.

5. The method as claimed in claim 1 wherein attaching the first high temperature resistant layer further comprises attaching the first high temperature resistant layer on an upper surface of the top substrate.

6. A stacked integrated circuit and package system comprising:
a first top integrated circuit located within a top substrate;
a second top integrated circuit located on a surface opposite of an active area of the top substrate of the first top integrated circuit;
top electrical connectors on the lower surface of the top substrate so a flattened side of the electrical connector is coplanar with a side of the first top integrated circuit and a side of the second top integrated circuit; and
a bottom package connected to the top electrical connectors, wherein the bottom package further comprises bottom electrical connectors with smaller dimensions that the top electrical connectors dimensions.

7. The system as claimed in claim 6 further comprising a high temperature resistant layer on the top substrate.

8. The system as claimed in claim 6 further comprising a temporary layer on the bottom substrate.

9. The system as claimed in claim 6 wherein the top electrical connectors further comprise a solder ball grid array.

10. A stacked integrated circuit and package system comprising:
a high temperature resistant layer on a top substrate;
a first top integrated circuit on the high temperature resistant layer and the first top integrated circuit located within the top substrate;
a second top integrated circuit on the first top integrated circuit;
an encapsulant over the first top integrated circuit, the second top integrated circuit and the top substrate;
a third top integrated circuit over the first top integrated circuit on a surface opposite the second top integrated circuit;
a fourth top integrated circuit on the third top integrated circuit;
an encapsulant over the third top integrated circuit, the fourth top integrated circuit and the top substrate;
top electrical connectors on a lower surface of the top substrate; and
a bottom package mounted to the top electrical connectors, wherein the bottom package further comprises bottom electrical connectors with smaller dimensions than the top electrical connectors dimensions.

11. The system as claimed in claim 10 wherein the bottom package further comprises:
a temporary layer on a bottom substrate;
a first bottom integrated circuit on the temporary layer; and
a second bottom integrated circuit on the first bottom integrated circuit.

12. The system as claimed in claim 10 wherein the bottom package further comprises:
a temporary layer on a bottom substrate; and
a bottom integrated circuit on the temporary layer.

13. The system as claimed in claim 10 wherein the first high temperature resistant layer further comprises the first high temperature resistant layer on an upper surface of the top substrate.

* * * * *